United States Patent
Chuang et al.

(10) Patent No.: US 9,215,796 B2
(45) Date of Patent: Dec. 15, 2015

(54) TOUCH PANEL

(71) Applicant: HannsTouch Solution Incorporated, Tainan (TW)

(72) Inventors: Yao Chih Chuang, Tainan (TW); Han Ming Chen, Tainan (TW); Jia Ming Ye, Tainan (TW); Ching Feng Tsai, Tainan (TW); Hui Shu Li, Tainan (TW)

(73) Assignee: HANNSTOUCH SOLUTION INCORPORATED, Tainan (TW)

( * ) Notice: Subject to any disclaimer, the term of this patent is extended or adjusted under 35 U.S.C. 154(b) by 325 days.

(21) Appl. No.: 13/850,451

(22) Filed: Mar. 26, 2013

(65) Prior Publication Data
US 2014/0182888 A1    Jul. 3, 2014

(30) Foreign Application Priority Data
Dec. 28, 2012    (TW) .............................. 101225569 U

(51) Int. Cl.
*H05K 1/03*    (2006.01)
*H05K 1/02*    (2006.01)
*G06F 3/044*    (2006.01)

(52) U.S. Cl.
CPC .............. *H05K 1/0274* (2013.01); *G06F 3/044* (2013.01); *H05K 1/0289* (2013.01)

(58) Field of Classification Search
CPC ..................................................... H05K 1/0274
USPC .................. 174/250, 251, 255–258, 261–262
See application file for complete search history.

(56) References Cited

U.S. PATENT DOCUMENTS

| | | | |
|---|---|---|---|
| 2010/0171718 A1* | 7/2010 | Denda ............................ | 345/173 |
| 2010/0238133 A1* | 9/2010 | Wu et al. ........................ | 345/174 |
| 2011/0285640 A1* | 11/2011 | Park et al. ...................... | 345/173 |
| 2012/0262385 A1* | 10/2012 | Kim et al. ...................... | 345/173 |
| 2012/0269402 A1* | 10/2012 | Souparis ........................ | 382/112 |
| 2013/0038545 A1* | 2/2013 | Hsu et al. ....................... | 345/173 |
| 2013/0258614 A1* | 10/2013 | Misaki ........................... | 361/748 |
| 2014/0041924 A1* | 2/2014 | Cok ............................... | 174/268 |

* cited by examiner

*Primary Examiner* — Hoa C Nguyen
(74) *Attorney, Agent, or Firm* — Hauptman Ham, LLP

(57) ABSTRACT

A touch panel has a substrate on which a first conductive layer, an insulating layer, a second conductive layer and a protective layer are formed in order. The second conductive layer and the first conductive layer form a touch-sensing area. The protective layer and the substrate have the same refractive index; and the first conductive layer, the insulating layer and the second conductive layer have the same refractive index so that the whole layered structure substantially has a symmetrical distribution of refractive indices, and leading to having optical characteristics of high transmittance and low reflectance.

3 Claims, 8 Drawing Sheets

TOUCH PANEL

CROSS-REFERENCE

This Application claims priority of Taiwan Patent Application No. 101225569, filed on Dec. 28, 2012 in the TIPO (Taiwan Intellectual Property Office), which is hereby incorporated by reference in its entirety.

BACKGROUND OF THE INVENTION

1. Field of the Invention

The present invention relates to a touch panel, especially to a touch panel having a multi-layer structure in which layers of the structure are symmetrically distributed in accordance with refractive index.

2. Description of the Related Art

In recent years, many electronic devices, such as mobile phones and tablet personal computers, are equipped with a touch sensor function. A touch panel is used as an input/output interface where a user may slide his finger or a stylus on the touch panel to control an electronic device.

The touch sensing technologies used in the present touch panel may be different, wherein the capacitive touch sensing technology has become the most commonly used technology. With reference to FIGS. 1 and 2, FIG. 1 is a structural schematic view of a conventional capacitive touch panel, and FIG. 2 is a cross-sectional view taken along the line AA in FIG. 1. The conventional capacitive touch panel mainly includes a glass substrate 9, a black matrix layer 93, multiple first electrodes 90, multiple second electrodes 91, multiple first connecting wires 98, multiple second connecting wires 99 and a protective layer 94. The black matrix layer 93 is formed on the periphery region of a surface of the glass substrate 9 so as to form a shading area. The first electrodes 90 are formed on the surface of the glass substrate 9 and are arranged in a matrix manner and are connected in serial along an X-axis direction by multiple first conductive wires 900. The second electrode 91 are formed on the surface of the glass substrate 9 and are arranged in a matrix manner, wherein the second electrodes 91 are respectively arranged between the first electrodes 90, and the second electrodes 91 are connected in serial along a Y-axis direction by multiple second conductive wires 910. The first electrodes 90 and the second electrodes 91 are connected to a peripheral control circuit respectively through the first connecting wires 98 and the second connecting wires 99. The protective layer 94 covers the black matrix layer 93, the first electrodes 90, the second electrodes 91, the first connecting wires 98 and the second connecting wires 99. With reference to FIG. 2, in order to prevent the first conductive wire 900 and the second conductive wires 910 from being in contact with each other, multiple bridge insulation members 92 are disposed between the first conductive wires 900 and the second conductive wires 910 at the intersections of the first conductive wires 900 and the second conductive wires 910, so that the first conductive wires 900 can be insulated from the second conductive wires 910.

In the foregoing capacitive touch panel, the insulatedly-crossed first electrodes 90 and second electrodes 91 can produce capacitors and thereby form a touch-sensing area. When a user uses his finger to touch the surface of the capacitive touch panel, the capacitance of the capacitor at the touch point will be changed such that the peripheral control circuit connected to the first electrodes 90 and the second electrodes 91 can locate the position of the finger touch from the change of capacitance.

During the production process of the foregoing touch panel, the black matrix layer 93 is first formed on the surface of the glass substrate 9, and then a transparent conductive layer is mounted on the surfaces of the glass substrate 9 and the black matrix layer 93 to form the first electrodes 90 and the second electrodes 91 through a patterning process. At this time the black matrix layer 93 at the periphery region has a thickness being larger than a thickness of the patterned transparent conductive layer in the touch-sensing area, and thereby creating a height difference at edges of the touch-sensing area. Thus, in the follow-up process of mounting the protective layer 94, a thickness of the protective layer 94 may change at the edges of the touch-sensing area and then cause a rainbow mura phenomenon to occur at the edges of the touch-sensing area due to light interference.

Furthermore, the bridge insulation members 92 which are only mounted at intersections of the conductive wires do not contribute to the mechanical performance of the touch panel. Besides, since the bridge insulation members 92 are usually made from photoresists having a refractive index of about 1.5, the refractive index of the bridge insulation members 92 is lower than the refractive index of the first electrodes 90 and the second electrodes 91, and thereby the conditions of refraction of light through the bridge insulation member 92 and through the electrodes are different, such that a user may easily see the outline of the wirings of the first electrodes 90 and the second electrode 91.

Therefore, it is necessary to provide a touch panel to overcome the problems existing in the conventional technology.

SUMMARY OF THE INVENTION

In view of the shortcomings of the conventional technology, the main objective of the invention is to provide a touch panel having a multi-layer structure in which layers are symmetrically distributed in accordance with refractive index. The touch panel has optical characteristics of high transmittance and low reflection and prevents the occurrence of rainbow mura phenomenon.

In order to achieve the foregoing object of the present invention, the present invention provides a touch panel having a substrate, a first conductive layer, an insulating layer, a second conductive layer and a protective layer. The substrate has a first refractive index. The first conductive layer has a second refractive index and is patterned and formed on the substrate. The insulating layer has a third refractive index and covers the first conductive layer. The second conductive layer has a fourth refractive index and is patterned and formed on the insulating layer to constitute a touch-sensing area with the first conductive layer. The protective layer has a fifth refractive index and covers the second conductive layer. The first refractive index and the fifth refractive index fall between 1.5 and 1.6, the second refractive index, the third refractive index and the fourth refractive index fall between 1.7 and 2.2, so that a multi-layer structure constituted by at least the substrate, the first conductive layer, the insulating layer, the second conductive layer and the protective layer has a symmetrical distribution of refractive index.

Layers being symmetrically distributed in accordance with refractive index contribute to achievement of optical characteristics of high transmittance and low reflection. And the insulating layer can buffer the effects of stress between the substrate and the electrode layer so as to provide the touch-sensing structure with a better mechanical performance.

The present invention further provide a touch panel having a substrate, a first conductive layer, an insulating layer, a shading layer, a second conductive layer and a protective layer. The first conductive layer is patterned and formed on the substrate. The insulating layer covers the first conductive layer. The shading layer is formed on the substrate, surrounds the first conductive layer and correspondingly covers a periphery of the insulating layer to provide a shading area. The second conductive layer is patterned and formed on the insulating layer to constitute a touch-sensing area with the first conductive layer. The protective layer covers the second conductive layer and the shading layer.

Since the shading layer correspondingly covers the peripheral region of the insulating layer, which means the shading layer is formed after forming the insulating layer, and the thickness of the insulating layer is substantially equal to or larger than the thickness of the shading layer, the thickness of the shading layer will taper towards the edges of the substrate. After forming the second conductive layer and the protective layer, the thickness of the protective layer will also taper towards the edges of the substrate along with the shading layer, which means the thickness of the protective layer will only change within the shading area. Thus, the protective layer can maintain a consistent thickness within the touch-sensing area to prevent the occurrence of rainbow mura phenomenon.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

Figure 3A:
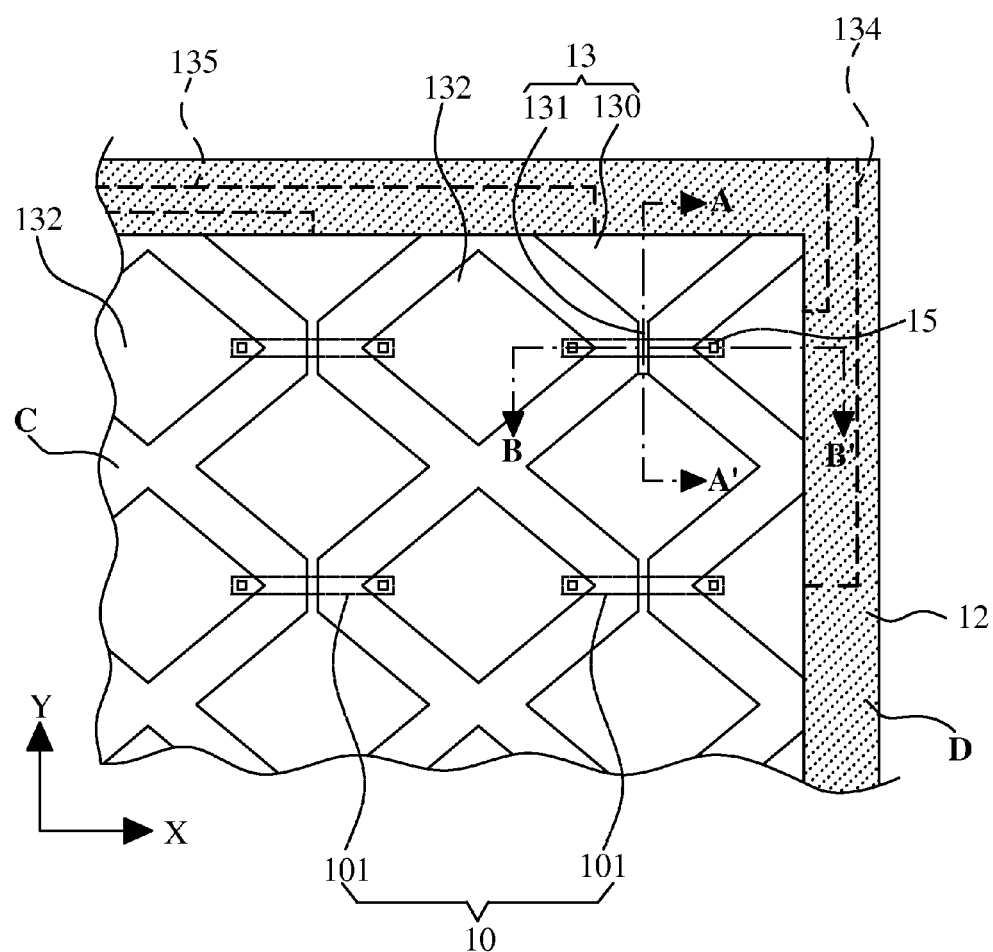
FIG. 3A is a schematic view of electrode pattern arrangement of a touch panel according to a preferred embodiment of the present invention.
Figure 3B:
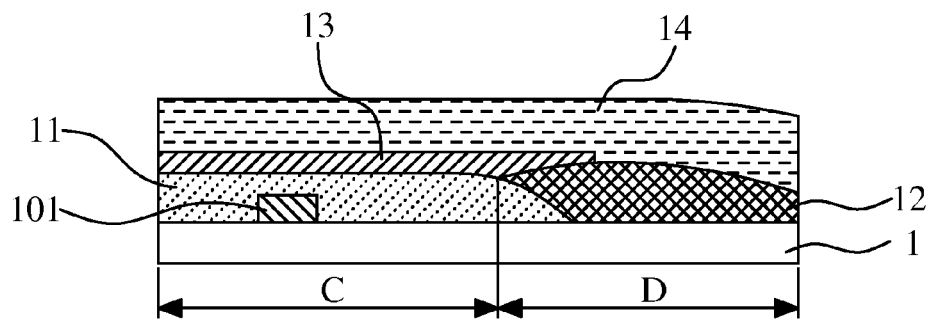
FIG. 3B is a cross-sectional view taken along the line AA' in FIG. 3A.
Figure 3C:
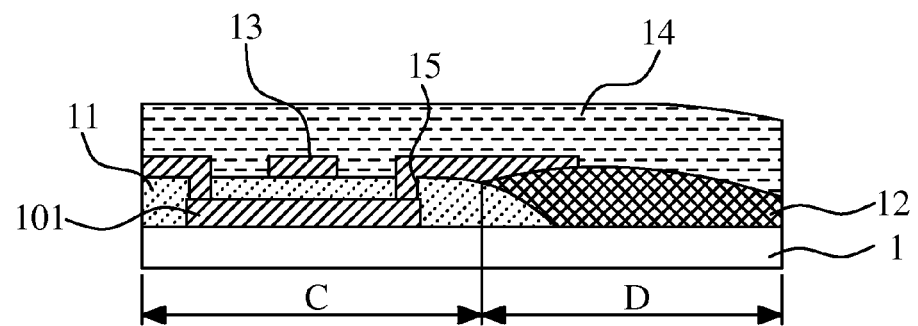
FIG. 3C is a cross-sectional view taken along the line BB' in FIG. 3A.

With reference to FIGS. 3A to 3C, FIG. 3A is a schematic view of electrode pattern arrangement of a touch panel according to a preferred embodiment of the present invention, and FIGS. 3B and 3C are cross-sectional views respectively taken along the line AA' and BB' in FIG. 3A. The touch panel mainly has a substrate 1, a first conductive layer 10, an insulating layer 11, a second conductive layer 13, a shading layer 12 (e.g. a black matrix layer) and a protective layer 14.

The substrate 1 in this embodiment is a transparent glass and has a first refractive index. The first refractive index falls between 1.5 and 1.6, such as 1.5.

The first conductive layer 10 is patterned and formed on the substrate 1. With further reference to FIG. 3A, the first conductive layer 10 is a transparent conductive film (e.g. indium tin oxide) made after performing exposure, development and etching steps. In this embodiment, the first conductive layer 10 includes multiple bar-shaped bridging structures 101 which are not connected with each other and are arranged in a matrix manner. The first conductive layer 10 has a second refractive index being larger than the foregoing first refractive index and may fall between 1.7 and 2.2. Each of the bridging structures 101 is used to connect two adjacent first electrodes 132, so that a plurality of the first electrodes 132 can be electrically connected along a first direction (e.g. X-axis direction).

The insulating layer 11 fully covers the first conductive layer 10 and has multiple through holes 15. In more detail, the insulating layer 11 is fully coated on the first conductive layer 10 and the substrate 1 to cover the bridging structures 101, wherein each of the bridging structures 101 has two ends which respectively correspond to one of the through holes 15. It is worth noting that the so-called "the insulating layer 11 is fully coated" means that the insulating layer 11 is formed into an entire film structure which covers the bridging structures 101 at the same time instead of being formed into multiple separated structures. In this embodiment, the insulating layer 11 is made of high refractive index photoresist and therefore has a third refractive index which may fall between 1.7 and 2.2. Preferably the third refractive index is substantially equal to the second refractive index.

The second conductive layer 13 is patterned and formed on the insulating layer 11 and thereby forms a touch-sensing area (area "C" as shown in FIG. 3A) with the first conductive layer 10. The touch-sensing area may be substantially equal to the insulating layer 11 in size and shape. With reference to FIG. 3B and FIG. 3C, in this embodiment, the second conductive layer 13 is also a transparent conductive film (e.g. indium tin oxide) made after performing exposure, development and etching steps and includes multiple first electrodes 132, multiple second electrodes 130 and multiple second conductive wires 131. The first electrodes 132 and the second electrodes 130 are arranged in a matrix manner (as shown in FIG. 3A). As shown in FIG. 3C, two adjacent ones of the first electrodes 132 which are adjacent in an X-axis direction are electrically connected to each other via two adjacent corresponding through holes 15 and a corresponding bridging structure 101 of the first conductive layer 10. Besides, each of the second conductive wires 131 connects two adjacent ones of the second electrodes 130 and crosses a corresponding bridging structure 101 so that the second electrodes 130 are connected in serial in a second direction (e.g. Y-axis direction). In this embodiment, the second conductive layer 13 has a fourth refractive index which falls between 1.7 and 2.2 and is preferably substantially equal to the second refractive index.

The shading layer 12 is formed on the substrate 1 and surrounds the first electrodes 132 and the second electrodes 130 of the second conductive layer 13. The shading layer 12 covers a periphery of the insulating layer 11 and provides a shading area (area "D" as shown in FIG. 3A). The shading area is used to surround the touch-sensing area so as to shade the first connecting wires 134 and the second connecting wires 135 which are connected to the first electrodes 132 and second electrodes 130. It is worth noting that in this embodiment the shading layer 12 covers the periphery of the insulating layer 11, and the second conductive layer 13 covers a periphery of the shading layer 12. With reference to FIG. 3A, the first electrodes 132 and the second electrodes 130 are connected to a peripheral control circuit respectively through the first connecting wires 134 and the second connecting wires 135, respectively, wherein the first connecting wires 134 and the second connecting wires 135 are mounted on the shading layers 12 and may be made of the same transparent electrically conductive material as the second conductive layer 13 or metallic material.

Furthermore, the touch panel of the present invention further includes a protective layer 14. The protective layer 14 is transparent and covers the second conductive layer 13, the insulating layer 11 and the shading layer 12. The protective layer 14 has a fifth refractive index which falls between 1.5 and 1.6 and is preferably substantially equal to the first refractive index.

Figure 4:
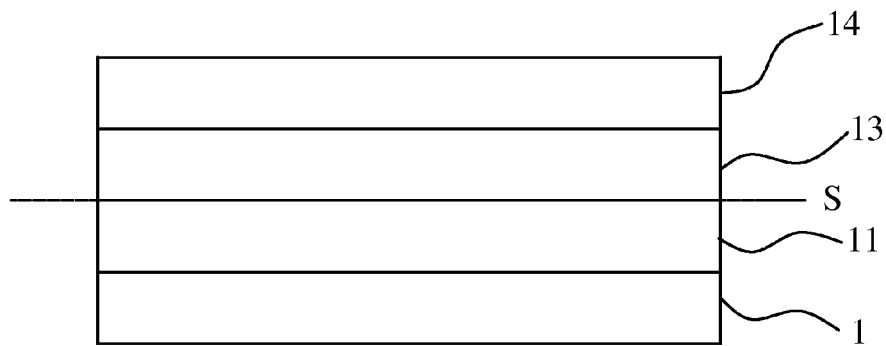
FIG. 4 is a schematic diagram illustrating a multi-layer structure within the touch-sensing area of the touch panel in FIG. 3A.

With reference to FIGS. 3A to 3C, it can be seen that the bridging structures 101 of the first conductive layer 10 are covered by the insulating layer 11 and the size of the bridging structures 101 is far smaller than the entire insulating layer 11. When the insulating layer 11 and the first conductive layer 10 has substantially the same refractive index, the bridging structures 101 of the first conductive layer 10 can be seen as a part of the insulating layer, optically, or the optical effect provided by the bridging structures 101 can be ignored within the touch-sensing area. In other words, when discussing the refractive indices and the transmittance of the layers in the touch panel, as shown in FIG. 4, the multi-layer structure within the range of the touch-sensing area can be simplified as only containing the substrate 1, the insulating layer 11, the second conductive layer 13 and the protective layer 14, wherein as mentioned above the substrate 1 has the first refractive index between 1.5 and 1.6, the insulating layer 11 has the third refractive index between 1.7 and 2.2, the second conductive layer 13 has the fourth refractive index between 1.7 and 2.2 and the protective layer 14 has the fifth refractive index between 1.5 and 1.6. In one embodiment, the protective layer 14 may be designed to have substantially the same refractive index as the substrate 1, that is, the first refractive index may be substantially equal to the fifth refractive index; and the insulating layer 11 may be designed to have substantially the same refractive index as the second conductive layer 13, that is the third refractive index may be substantially equal to the fourth refractive index. For example, the protective layer 14 and the substrate 1 have the same refractive index of 1.6, and the insulating layer 11 and the second conductive layer 13 have the same refractive index of 2.0, that is, compared with the protective layer 14 and the substrate 1, the insulating layer 11 and the second conductive layer 13 have a higher refractive index. Therefore, the refractive indices of the layers in the multi-layer structure in FIG. 4 from the first layer to the last layer are listed as follows: 1.6 (low refractive index), 2 (high refractive index), 2 (high refractive index), 1.6 (low refractive index). With respect to an imaginary symmetrical center line S of the overall layered structure of the touch panel, which is also a boundary line between the insulating layer 11 and the second conductive layer 13 in this embodiment, it can be seen that the multi-layer structure of the touch panel constituted by the substrate, the first conductive layer, the insulating layer, the second conductive layer and the protective layer has a symmetrical distribution of refractive index. Thus, compared with the conventional technologies partially forming the insulating layer and bridging members that cause a mismatch between refractive indices and lead to poor optical performance, the present invention using the fully-coated and high refractive index insulating layer 11 to constitute a touch-sensing structure with other layers, so that the touch panel can have a multi-layer structure that has a symmetrical distribution of refractive index, thereby achieving improved optical characteristics of high transmittance and low reflection and therefore the outline of the wirings of the first conductive layers 10 and the second conductive layers 13 (including the first electrodes 132 and the second electrodes 130) will not be obvious to the eyes of the user.

Although the embodiment is described with a four-layer structure, however, the present invention can be carried out by other multi-layer structure as long as layers in the multi-layer structure are designed to have a symmetrical distribution of refractive index with respect to a center line of the multi-layer structure.

Since the insulating layer 11 is fully-coated, the insulating layer can buffer the effects of stress between the substrate 1 and the first conductive layer 10 and the second conductive layer 13 to provide the touch-sensing structure with a better mechanical performance.

Figure 1:
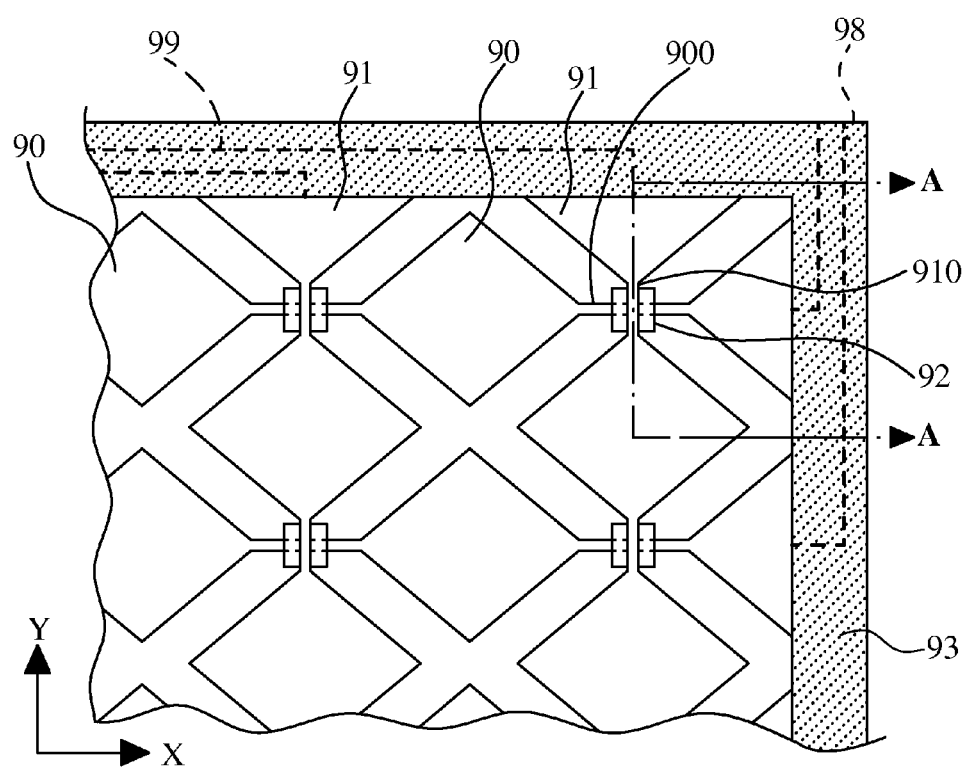
FIG. 1 is a top view of a part of a conventional capacitive touch panel.
Figure 2:
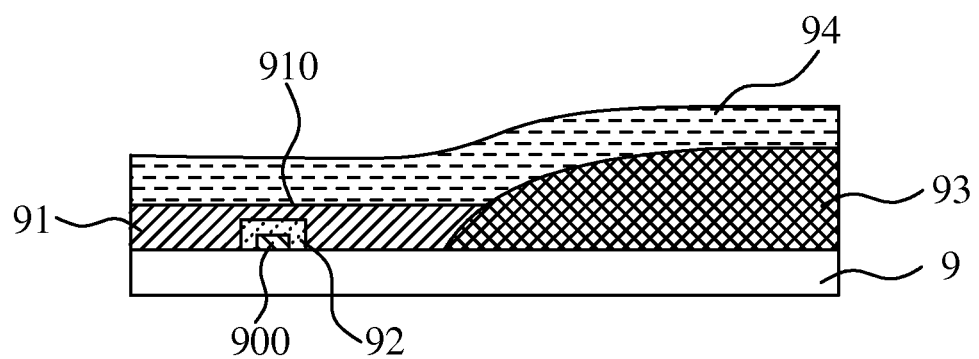
FIG. 2 is a cross-sectional view taken along the line AA in FIG. 1.

Besides, since the shading layer 12 is formed on the insulating layer 11, the insulating layer 11 will have a thickness equal to or larger than the thickness of the shading layer 12. Thus after forming the protective layer 14, the surface of the protective layer 14 locating at the boundary between the insulating layer 11 and shading layer 12 will be substantially parallel to the surface of the substrate 1, as shown in FIG. 3B. In other words, comparing FIG. 2 with FIG. 3B, it is worth noting that the protective layer 14 above the boundary between the second conductive layer 13 and the shading layer 12 does not have a concave portion, and the thickness of the protective layer 14 only changing within the shading area, such as tapering in a direction towards the edges of the substrate 1, will not affect the optical performance of the touch panel within the range of the touch-sensing area, thereby the touch panel can maintain consistency of conditions for refraction and reflection within the range of the touch-sensing area, so as to avoid rainbow mura phenomenon.

Figure 5A:
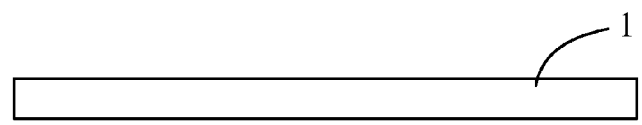
FIGS. 5A to 5G are schematic diagrams of implementing a manufacturing method of the touch panel shown in FIG. 3A.
Figure 5B:
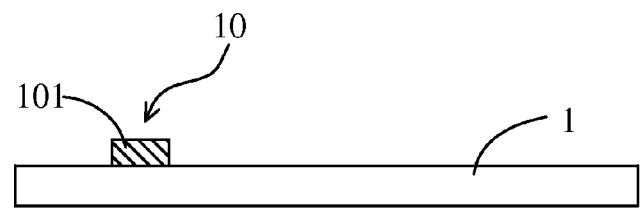
Figure 5C:
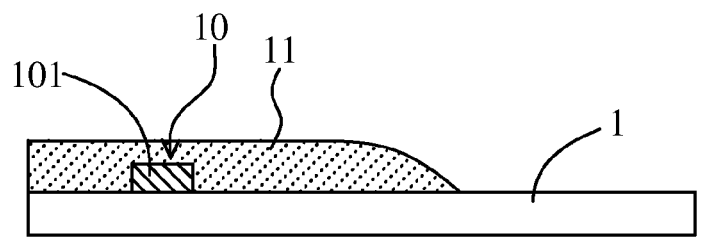
Figure 5D:
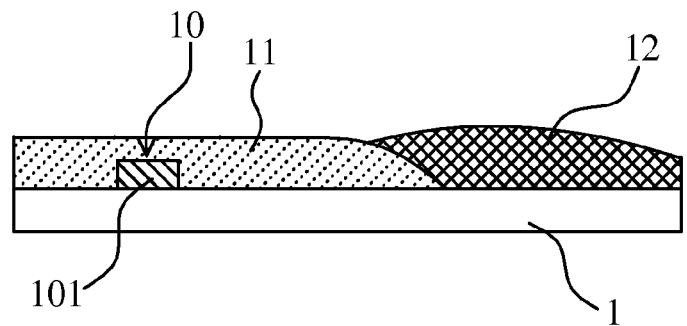
Figure 5E:
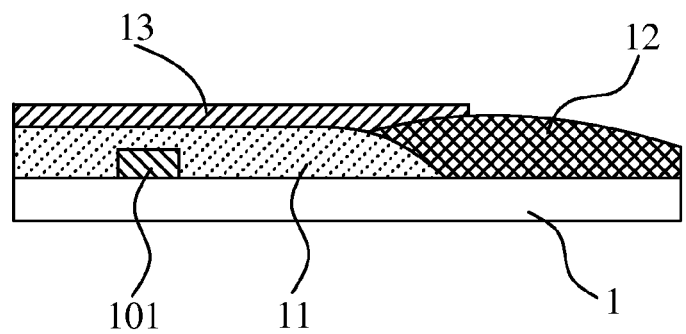
Figure 5F:
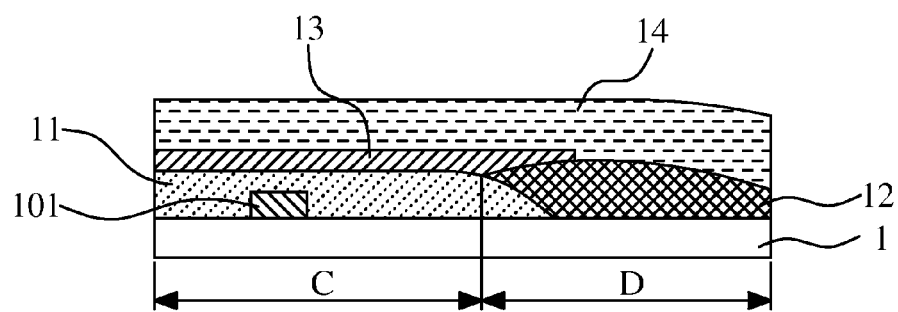
Figure 5G:
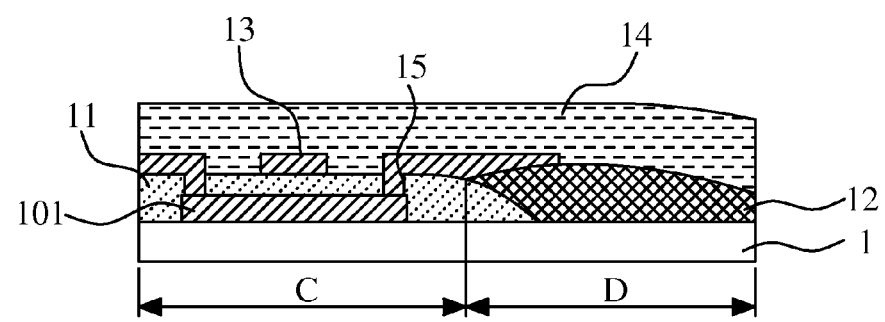

With regard to a manufacturing method of the touch panel of the present invention, please refer to FIGS. 5A to 5G. The manufacturing method includes a step of providing a substrate 1 as shown in FIG. 5A, a step of forming a first conductive layer 10 as shown in FIG. 5B, a step of forming an insulating layer 11 as shown in FIG. 5C, a step of forming a shading layer 12 as shown in FIG. 5D, a step of forming a second conductive layer 13 as shown in FIG. 5E and a step of forming a protective layer 14 as shown in FIGS. 5F and 5G.

The step of forming the first conductive layer 10 is to first form a transparent conductive film on a surface of the substrate 1 and then perform exposure, development and etching processes to pattern the transparent conductive film so as to obtain multiple bridging structures 101 arranged in a matrix manner as the first conductive layer 10.

The step of forming the insulating layer 11 is to perform a full-coating process to fully coat the insulating layer 11 on the first conductive layer 10 and the substrate 1, and then perform exposure, development and etching processes for the insulating layer 11 to define the shape of the insulating layer 11 and multiple through holes 15.

The step of forming the shading layer 12 is to form the shading layer 12 on the insulating layer 11 and the substrate 1 so that the shading layer 12 surrounds the first conductive layer 10 and the insulating layer 11 and correspondingly covers a periphery of the insulating layer 11 to provide a shading area.

The step of forming the second conductive layer 13 is to form another electrically conductive film on the substrate 1 and the shading layer 12 and then perform exposure, development and etching processes to pattern the electrically conductive film so as to obtain multiple first electrodes 132 and multiple second electrodes 130 as the second conductive layer 13, wherein the second conductive layer 13 is partially formed inside the through holes 15 so that the adjacent first electrodes 132 of the second conductive layer 13 can be connected to each other through the corresponding through holes 15 and the corresponding bridging structure 101 of the first conductive layer 10.

The step of forming the protective layer 14 is to form the protective layer 14 so that the protective layer 14 covers the second conductive layer 13, the insulating layer 11 and the shading layer 12.

Figure 6A:
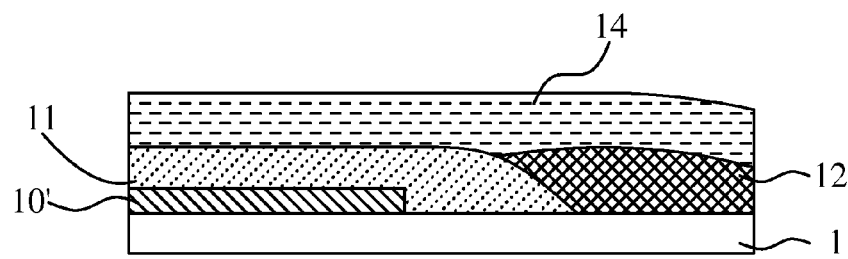
FIG. 6A is a cross-sectional view of the touch panel according to another preferred embodiment of the present invention.
Figure 6B:
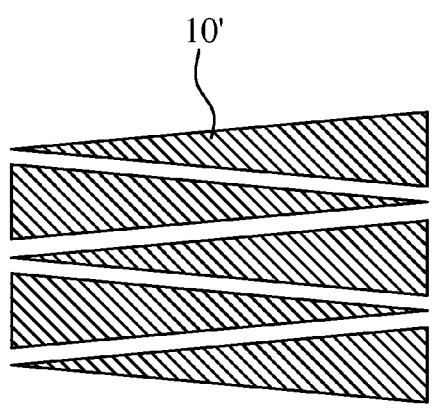
FIG. 6B is a schematic view of electrode pattern arrangement of a touch panel according to another preferred embodiment of the present invention.
Figure 7:
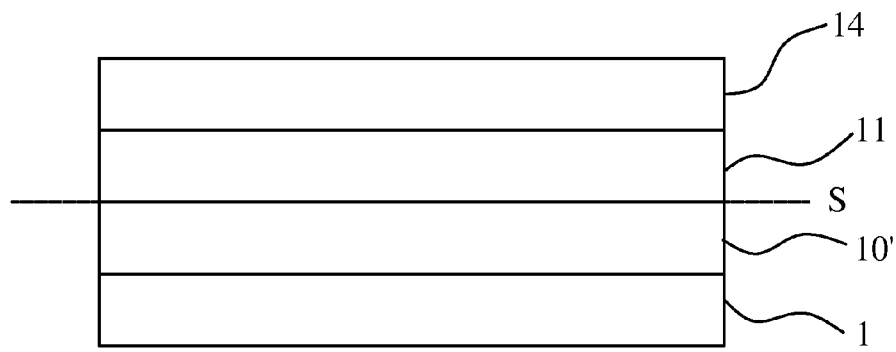
FIG. 7 is a schematic diagram illustrating a multi-layer structure within the touch-sensing area of the touch panel in FIG. 6A.

With further reference to FIG. 6A, FIG. 6A is a cross-sectional view of the touch panel according to another preferred embodiment of the present invention. The touch panel in FIG. 6A is similar to the touch panel of the embodiment in FIG. 3A and has a substrate 1, a conductive layer 10', an insulating layer 11, a shading layer 12 and a protective layer 14. The substrate 1 has a first refractive index between 1.5 and 1.6. The conductive layer 10' is formed on the substrate 1 and is patterned to provide a touch-sensing area. With further reference to FIG. 6B, the conductive layer 10' may include multiple bar-shaped electrodes arranged side by side at intervals, and the conductive layer 10' has a second refractive index between 1.7 and 2.2. The insulating layer 11 is fully coated on the conductive layer 10' and has a third refractive index substantially the same as the second refractive index, such as falling between 1.7 and 2.2. The shading layer 12 is formed on the insulating layer 11 and the substrate 1, surrounds the conductive layer 10' and correspondingly covers a periphery of the insulating layer 11, so as to provide a shading area. The protective layer 14 covers the conductive layer 10', the insulating layer 11 and the shading layer 12, wherein the protective layer 14 has a fourth refractive index substantially the same as the first refractive index, such as between 1.5 and 1.6. Similarly, in this embodiment, with reference to FIG. 7, a multi-layer structure constituted by the substrate 1, the conductive layer 10', the insulating layer 11 and the protective layer 14 also has a symmetrical distribution of refractive index. Thus, the touch-sensing structure of this embodiment can also achieve improved optical characteristics of high transmittance and low reflection.

Also, since the shading layer 12 is formed on the insulating layer 11, the insulating layer 11 will have a thickness equal to or larger than the thickness of the shading layer 12. Thus after forming the protective layer 14, the surface of the protective layer 14 locating at the boundary between the insulating layer 11 and shading layer 12 will be substantially parallel to the surface of the substrate 1, as shown in FIG. 3B. In other words, comparing FIG. 2 with FIG. 6, it is worth noting that the protective layer 14 above the boundary between the second conductive layer 13 and the shading layer 12 does not have a concave portion, and the thickness of the protective layer 14 only changing within the shading area, such as tapering in a direction towards the edges of the substrate 1, will not affect the optical characteristics of the touch panel with the range of the touch-sensing area, thereby the touch panel can maintain consistency of conditions for refraction and reflection within the range of the touch-sensing area, so as to avoid rainbow mura phenomenon.

By the above description, the touch panel of the present invention uses multiple layers being symmetrically distributed in accordance with refractive index to form its touch-sensing structure and adjusts the order of forming the shading layer, so that the overall structure can have a better mechanical performance and provide improved optical characteristics to avoid the occurrence of rainbow mura phenomenon.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A touch panel comprising:
a substrate having a first refractive index;
a first conductive layer having a second refractive index and being patterned and formed on the substrate;
an insulating layer having a third refractive index and covering the first conductive layer;
a second conductive layer having a fourth refractive index and being patterned and formed on the insulating layer to constitute a touch-sensing area with the first conductive layer;
a shading layer being formed on the substrate and the insulating layer, surrounding the touch-sensing area and covering a periphery of the insulating layer; and
a protective layer having a fifth refractive index and covering the second conductive layer,
wherein the first refractive index and the fifth refractive index fall between 1.5 and 1.6, the second refractive index, the third refractive index and the fourth refractive index fall between 1.7 and 2.2, so that a multi-layer structure constituted by at least the substrate, the first conductive layer, the insulating layer, the second conductive layer and the protective layer has a symmetrical distribution of refractive index, and
wherein the second conductive layer covers a periphery of the shading layer so that a portion of the shading layer is disposed between the insulating layer and the second conductive layer.

2. The touch panel as claimed in claim 1, wherein the first refractive index is substantially equal to the fifth refractive index; the second refractive index, the third refractive index and the fourth refractive index are substantially equal to each other.

3. The touch panel as claimed in claim 1, wherein
the first conductive layer includes multiple bridging structures;
the insulating layer fully covers the first conductive layer and has multiple through holes, wherein each of the bridging structures has two ends which respectively correspond to one of the through holes; and
the second conductive layer includes multiple first electrodes and multiple second electrodes, wherein the first electrodes and the second electrodes are arranged in a matrix manner, and at least two adjacent ones of the first electrodes are connected to each other through two adjacent ones of the through holes and a corresponding one of the bridging structures.

* * * * *